(12) United States Patent
Miyazaki et al.

(10) Patent No.: US 9,768,372 B2
(45) Date of Patent: Sep. 19, 2017

(54) SEMICONDUCTOR DEVICE, SUPERCONDUCTING DEVICE, AND MANUFACTURING METHOD OF SEMICONDUCTOR DEVICE

(71) Applicant: Kabushiki Kaisha Toshiba, Minato-ku (JP)

(72) Inventors: Hisao Miyazaki, Yokohama (JP); Yuichi Yamazaki, Inagi (JP); Tadashi Sakai, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 453 days.

(21) Appl. No.: 14/475,846

(22) Filed: Sep. 3, 2014

(65) Prior Publication Data

US 2015/0080223 A1   Mar. 19, 2015

(30) Foreign Application Priority Data

Sep. 18, 2013  (JP) ................. 2013-192900

(51) Int. Cl.
*H01L 39/24*  (2006.01)
*H01L 29/861*  (2006.01)
(Continued)

(52) U.S. Cl.
CPC .... *H01L 39/2493* (2013.01); *H01L 21/02381* (2013.01); *H01L 21/02439* (2013.01);
(Continued)

(58) Field of Classification Search
CPC .......... H01L 39/2493; H01L 21/02521; H01L 21/02507; H01L 21/02499;
(Continued)

(56) References Cited

U.S. PATENT DOCUMENTS 8,308,886 B2 * 11/2012 Andrews ............ H01L 51/0013
156/235
8,563,965 B2 * 10/2013 Bowers ................ H01L 21/04
257/29
(Continued)

FOREIGN PATENT DOCUMENTS

JP      9-259737       10/1997
JP      2007-204299    8/2007
(Continued)

OTHER PUBLICATIONS

U.S. Appl. No. 14/202,013, filed Mar. 10, 2014, Hisao Miyazaki, et al.

*Primary Examiner* — William Coleman
(74) *Attorney, Agent, or Firm* — Oblon, McClelland, Maier & Neustadt, L.L.P.

(57) ABSTRACT

A semiconductor device of an embodiment includes a layered substance formed by laminating two-dimensional substances in two or more layers. The layered substance includes at least either one of a p-type region having a first intercalation substance between layers of the layered substance and an n-type region having a second intercalation substance between layers of the layered substance. The layered substance includes a conductive region that is adjacent to at least either one of the p-type region and the n-type region. The conductive region includes neither the first intercalation substance nor the second intercalation substance. A sealing member is formed on the conductive region, or on the conductive region and an end of the layered substance.

9 Claims, 7 Drawing Sheets

(51) Int. Cl.
*H01L 29/868* (2006.01)
*H01L 39/22* (2006.01)
*H01L 29/66* (2006.01)
*H01L 29/778* (2006.01)
*H01L 29/16* (2006.01)
*H01L 21/02* (2006.01)
*H01L 29/84* (2006.01)

(52) U.S. Cl.
CPC .. *H01L 21/02444* (2013.01); *H01L 21/02458* (2013.01); *H01L 21/02499* (2013.01); *H01L 21/02507* (2013.01); *H01L 21/02521* (2013.01); *H01L 21/02664* (2013.01); *H01L 29/1606* (2013.01); *H01L 29/6603* (2013.01); *H01L 29/66045* (2013.01); *H01L 29/7781* (2013.01); *H01L 29/868* (2013.01); *H01L 29/8611* (2013.01); *H01L 39/223* (2013.01); *H01L 29/84* (2013.01)

(58) Field of Classification Search
CPC ......... H01L 21/02458; H01L 21/02664; H01L 21/02381; H01L 21/02439; H01L 21/02444; H01L 29/6603; H01L 29/1606; H01L 29/7781; H01L 29/66045; H01L 39/223; H01L 29/868; H01L 29/8611; H01L 29/84
See application file for complete search history.

(56) References Cited

U.S. PATENT DOCUMENTS

| | | | | |
|---|---|---|---|---|
| 8,728,433 | B2* | 5/2014 | Sutter | B82Y 30/00 423/448 |
| 8,890,277 | B2* | 11/2014 | Hebard | H01L 29/1606 257/29 |
| 9,236,432 | B2* | 1/2016 | Kub | H01L 29/66242 |
| 9,269,854 | B2* | 2/2016 | Jain | H01L 33/0079 |
| 2010/0028681 | A1* | 2/2010 | Dai | B82Y 30/00 428/408 |
| 2011/0006425 | A1 | 1/2011 | Wada et al. | |
| 2012/0080661 | A1 | 4/2012 | Saito et al. | |
| 2012/0168722 | A1 | 7/2012 | Chung et al. | |
| 2014/0231751 | A1 | 8/2014 | Wada et al. | |
| 2016/0284811 | A1* | 9/2016 | Yu | H01L 29/454 |

FOREIGN PATENT DOCUMENTS

| | | |
|---|---|---|
| JP | 2011-23420 | 2/2011 |
| JP | 2012-54303 | 3/2012 |
| JP | 2012-80006 | 4/2012 |
| JP | 2012-138451 A | 7/2012 |
| JP | 2012-248842 A | 12/2012 |
| JP | 2013-057006 | 3/2013 |
| JP | 2014-157923 | 8/2014 |
| JP | 2014-518827 A | 8/2014 |
| JP | 2014-212308 A | 11/2014 |
| WO | 2008/108383 A1 | 9/2008 |

* cited by examiner

SEMICONDUCTOR DEVICE, SUPERCONDUCTING DEVICE, AND MANUFACTURING METHOD OF SEMICONDUCTOR DEVICE

CROSS-REFERENCE TO RELATED APPLICATION

This application is based upon and claims the benefit of priority from Japanese Patent Application No. 2013-192900, filed on Sep. 18, 2013; the entire contents of which are incorporated herein by reference.

FIELD

Embodiments described herein relate to a semiconductor device, a superconducting device, and a manufacturing method of the semiconductor device.

BACKGROUND

Miniaturization limitation or speed-up limitation of a semiconductor device including silicon as a base becomes a significant problem. As a method of overcoming the miniaturization limitation, attention has been focused on an application of a layered substance that is ultimately thin conductor, such as graphene, $MoS_2$, $WSe_2$, or $SnS_2$. In such layered substance, a bond between layers is weaker than a bond between atoms in a layer. Therefore, the layered substance can form an intercalation compound including other atoms or molecules between layers. The atoms or molecules taken between layers become dopants that supply electrons or holes to the layered substance. Compared to a dopant that substitutes an atom in a crystal in an existing semiconductor, the dopant present between layers has small scattering effect to electrons or holes, thereby less reducing mobility. Accordingly, the dopant is also advantageous for increasing an operation speed of a semiconductor device.

DETAILED DESCRIPTION

Figure 1:
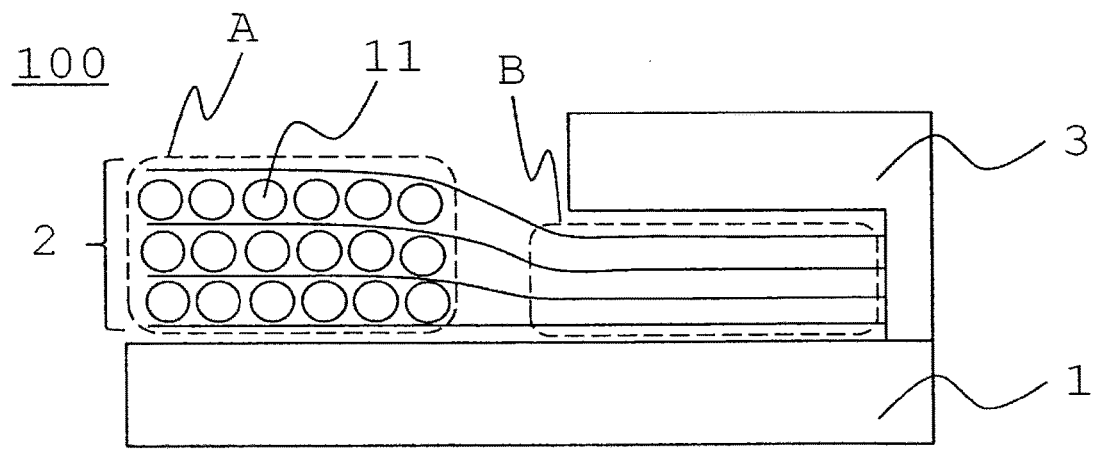
FIG. 1 is a conceptual view of a semiconductor device according to an embodiment.

A semiconductor device of an embodiment includes a layered substance formed by laminating two-dimensional substances in two or more layers. The layered substance includes at least either one of a p-type region having a first intercalation substance between layers of the layered substance and an n-type region having a second intercalation substance between layers of the layered substance. The layered substance includes a conductive region that is adjacent to at least either one of the p-type region and the n-type region. The conductive region includes neither the first intercalation substance nor the second intercalation substance. A sealing member is formed on the conductive region, or on the conductive region and an end of the layered substance. A distance between the layered substance in the conductive region and the sealing member on the conductive region is smaller than a diameter of a substance having the smallest diameter selected from the first intercalation substance and the second intercalation substance.

A superconducting device of an embodiment includes a layered substance formed by laminating two-dimensional substances in two or more layers. The layered substance includes a superconducting region having a third intercalation substance between layers of the layered substance. The layered substance includes a conductive region that is adjacent to the superconducting region. The conductive region does not include the third intercalation substance. A sealing member is formed on the conductive region. A distance between the layered substance in the conductive region and the sealing member on the conductive region is smaller than a diameter of a substance, having the smallest diameter, of the third intercalation substance.

A manufacturing method of a semiconductor device or a superconducting device of an embodiment includes forming a sealing member on a member, including a layered substance formed by laminating two-dimensional substances in two or more layers, at a portion on a part of the layered substance, and processing the member, on which the sealing member is formed, in a vapor phase or liquid phase containing any of intercalation substances, which make the layered substance into a p-type, an n-type, or a superconducting material and which are included between layers of the layered substance.

Embodiments will be described below with reference to the drawings.

In order to manufacture a semiconductor device by using the layered substance including a substance between layers as described above, atoms or molecules that become dopants have to be spatially selectively intercalated between layers. Uniform intercalation of atoms or molecules into a layered substance has previously been done, but spatially-selective intercalation has not yet been done.

Embodiments for embodying the present disclosure will be described below.

First Embodiment

A semiconductor device according to the embodiment includes: a layered substance formed by laminating two-dimensional substances in two or more layers, wherein the layered substance includes a p-type region having a first intercalation substance between layers of the layered substance, the layered substance includes a conductive region that is adjacent to the p-type region and that does not include the first intercalation substance, a sealing member is formed on the conductive region, and a distance between the layered substance in the conductive region and the sealing member on the conductive region is smaller than a diameter of a substance, having the smallest diameter, of the first intercalation substance. For example, a Schottky diode is included in the semiconductor device according to the first embodiment.

FIG. 1 is a conceptual view of a semiconductor device 100 according to the first embodiment. The semiconductor device 100 in FIG. 1 includes a substrate 1, a layered substance 2, a sealing member 3, and first intercalation substances 11. A region enclosed by a broken line A is a p-type region. A region enclosed by a broken line B is a conductive region. The region of the broken line B is present adjacent to the region of the broken line A. A boundary is generated between the p-type region A and the conductive region B depending upon an intercalation position of the first intercalation substances 11. The intercalation position of the first intercalation substances 11 is different depending upon a layer. Therefore, it is described that the region of the broken line B is adjacent to the region of the broken line A. When a semiconductor region or the like is not formed intentionally, a region of other conductivity (conductivity type) is not present between the adjacent regions.

The substrate 1 is, for example, a semiconductor layer or an insulating layer made of Si.

The layered substance 2 is a layered conductive substance formed on the substrate 1. The layered substance 2 is a laminate formed by laminating two-dimensional substances in two or more layers. The layered substance 2 is a laminate including one or more types selected from graphite, multilayer graphene, h-BN, and the like or a laminate of a compound including any of elements selected from Ti, Zr, Hf, V, Nb, Ta, Mo, W, Ga, In, Ge, Sn, Pb, and Bi and any of elements selected from S, Se, Te, and O. However, any substance having a layered structure can be used, and the layered substance 2 is not limited to these materials. Graphite includes the one having no bandgap, and graphene nanoribbon having bandgap. When the layered substance 2 having bandgap is used, the conductive region B becomes intrinsic semiconductor (i-type).

In the p-type region A, the first intercalation substances 11 are present between layers of the layered substance 2. The first intercalation substance 11 has high electron donating property. The region of the layered substance 2 where the first intercalation substances 11 are present between layers has a p-type characteristic due to the electron donating property of the first intercalation substance. The layered substance 2 in the p-type region A is thicker than the layered substance 2 in the conductive region B having no first intercalation substance 11, since a portion between layers is widened due to the first intercalation substances 11. A substance having high electron-withdrawing may be used for the intercalation substance to make the region where the intercalation substance is present n-type.

A molecule or compound containing one or more elements selected from F, Cl, Br, I, O, S, N, and P can be used for the first intercalation substance 11. For example, at least one or more molecules or compounds selected from halogen such as $F_2$, $Cl_2$, $Br_2$, or $I_2$, interhalogen compound such as IBr, or ICl, metal halide such as $FeCl_3$, $CuCl_2$, $AlCl_3$, $BF_4$, or $AsF_5$, and acid substance such as sulfuric acid, nitric acid, or phosphoric acid can be used as the first intercalation substance 11.

In the conductive region B of the layered substance 2, the first intercalation substance 11 is not present. The sealing member 3 that prevents an intercalation of the first intercalation substance 11 is provided on the conductive region B. The sealing member 3 restricts an increase in the thickness of the layered substance 2. The limit of the increase in the thickness falls within a range not exceeding the diameter of the first intercalation substance 11. Specifically, the distance between the layered substance 2 in the conductive region B and the sealing member 3 on the conductive region B is smaller than the diameter of the first intercalation substance 11. The sealing member 3 and the layered substance 2 may be in contact with each other. The distance between the layered substance 2 in the conductive region B and the sealing member 3 on the conductive region B is the shortest distance between the layered substance 2 in the conductive region B and the sealing member 3.

The sealing member 3 is made of an insulating or conductive material. An insulating material or a conductive material can be selected for the sealing member 3 according to a design. When the sealing member 3 is used, the sealing member 3 can serve as an electrode of the semiconductor device. The sealing member 3 is formed not only on the conductive region B but also on an end of the layered substance 2. In FIG. 1, the sealing member 3 is provided to restrict the increase in the thickness of the layered substance 2 and to prevent intercalation of the first intercalation substance 11 from one end of the layered substance 2. According to the sealing member 3 described above, the region where the first intercalation substance 11 is not present can be arranged adjacent to the region where the first intercalation substance 11 is present. Although not illustrated, the sealing member 3 may be fixed on a portion of the substrate 1 where the layered substance 2 is not present. The leakage of the first intercalation substance 11 from the end of the layered substance 2 in the p-type region A may also be prevented by an unillustrated sealing member.

Subsequently, a manufacturing method of the semiconductor device 100 in FIG. 1 will be described with reference to process conceptual views in FIGS. 2 and 3.

Figure 2:
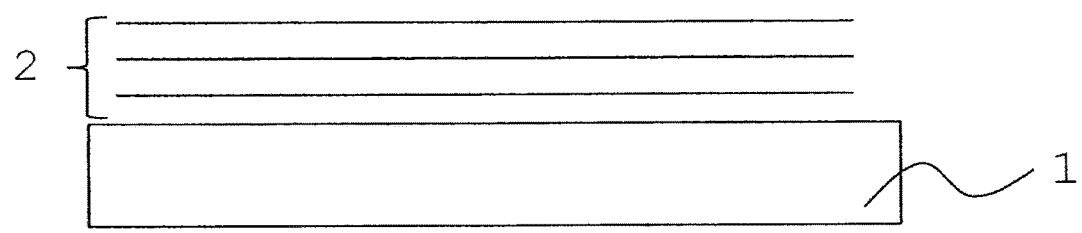
FIG. 2 is a process conceptual view illustrating a manufacturing process of the semiconductor device according to the embodiment.

In a member 101 illustrated in the process conceptual view in FIG. 2, the layered substance 2 is formed on the substrate 1. The layered substance 2 is combined or transferred on the substrate, thereby being formed on the substrate 1.

Figure 3:
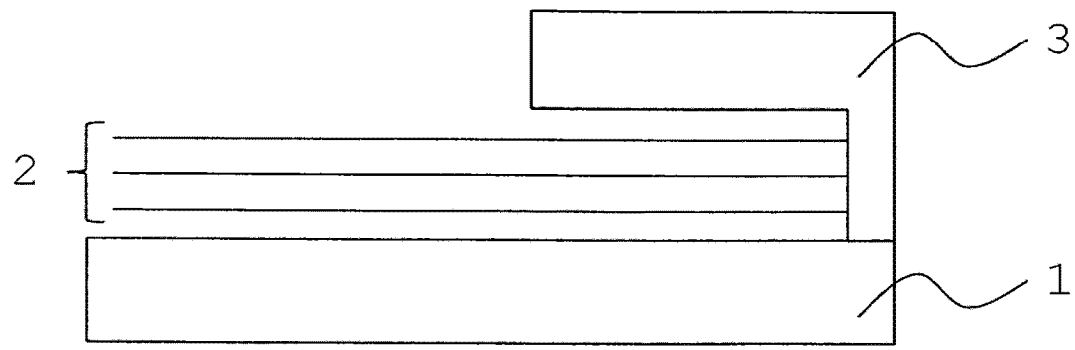
FIG. 3 is a process conceptual view illustrating a manufacturing process of the semiconductor device according to the embodiment.

In a member 102 illustrated in the process conceptual view in FIG. 3, the sealing member 3 is formed on the member 101. The sealing member 3 is formed such that material of the sealing member 3 is deposited and processed with a mask to have a target shape. Next, a process is carried out for the member 102 such that the first intercalation substances 11 are intercalated between layers of the layered substance 2 in a vapor phase or a liquid phase containing the first intercalation substances 11. A heating treatment may be executed, according to need. The first intercalation substances 11 can be intercalated from only one end due to the sealing member 3. The sealing member 3 restricts the increase in the thickness of the layered substance 2 in some region. The first intercalation substances 11 are intercalated in the region where the sealing member 3 is not formed. On the other hand, the intercalation of the first intercalation substances 11 is not carried out to the layered substance 2 in the region on which the sealing member 3 is formed. Since the region where the first intercalation substances 11 can be intercalated is restricted by the sealing member 3, the p-type region A having p-type due to the intercalation of the first intercalation substances 11 and the conductive region B to which the first intercalation substances 11 are not intercalated are present (adjacent to each other) in the layered substance 2.

Second Embodiment

A semiconductor device according to the second embodiment includes: a layered substance formed by laminating two-dimensional substances in two or more layers, wherein the layered substance includes a p-type region having a first intercalation substance between layers of the layered substance and an n-type region having a second intercalation substance between layers of the layered substance, the layered substance includes a conductive region that is adjacent to the p-type region and the n-type region and that includes neither the first intercalation substance nor the second intercalation substance, a sealing member is formed on the conductive region, or on the conductive region and an end of the layered substance, and a distance between the layered substance in the conductive region and the sealing member on the conductive region is smaller than a diameter of a substance having the smallest diameter selected from the first intercalation substance and the second intercalation substance. The n-type and p-type in the semiconductor device may be reversed.

Figure 4:
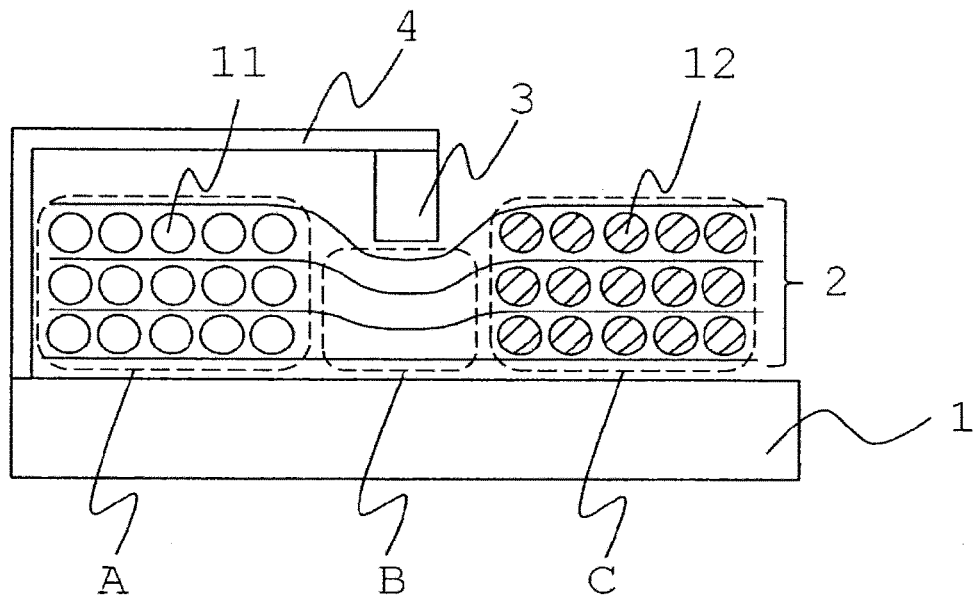
FIG. 4 is a conceptual view of a semiconductor device according to an embodiment.

FIG. 4 is a conceptual view of a semiconductor device 200 according to the second embodiment. The semiconductor device 200 in FIG. 4 includes a substrate 1, a layered substance 2, a sealing member 3, a cover member 4, first intercalation substances 11, and second intercalation substances 12. A region enclosed by a broken line A is a p-type region. A region enclosed by a broken line B is a conductive region. A region enclosed by a broken line C is an n-type region. The conductive region B is present between the p-type region A and the n-type region C. The conductive region B is adjacent to the p-type region A, and adjacent to the n-type region C. The semiconductor device 200 according to the second embodiment is similar to the semiconductor device 100 according to the first embodiment in many points. The description of the similar configuration and manufacturing method will partly be skipped.

The layered substance 2 is a layered conductive substance formed on the substrate 1. The p-type region A, the conductive region B, and the n-type region C are present in the layered substance 2. The conductive region B is present between the p-type region A and the n-type region C. When the layered substance 2 has no bandgap, the p-type region A and the n-type region C form a p-n junction. When the layered substance 2 has bandgap, the p-type region A, the conductive region B, and the n-type region C form a p-i-n junction. Therefore, the semiconductor device 200 according to the second embodiment functions as a diode having a pn junction or pin junction.

In the n-type region C, the second intercalation substances 12 are present between layers of the layered substance 2. The second intercalation substance 12 has high electron-withdrawing. The region of the layered substance 2 where the second intercalation substances 12 are present between layers has an n-type characteristic due to the electron-withdrawing of the second intercalation substance. The layered substance 2 in the n-type region C is thicker than the layered substance 2 in the conductive region B having no second intercalation substance 12, since a portion between layers is widened due to the second intercalation substances 12.

The second intercalation substance 12 contains one or more elements selected from Li, Na, K, Rb, Cs, Be, Mg, Ca, Sr, Y, Sc, Ba, Eu, Sm, Yb, Hg, and Tl. An alkali metal element or alkali rare-earth metal element such as Li, Na, K, Mg, or Ca can be used for the second intercalation substance 12.

In the conductive region B of the layered substance 2, neither the first intercalation substance 11 nor the second intercalation substance 12 is present. The sealing member 3 that prevents an intercalation of the first intercalation substance 11 and the second intercalation substance 12 is provided on the conductive region B. The sealing member 3 restricts an increase in the thickness of the layered substance 2. The limit of the increase in the thickness falls within a range not exceeding the diameter of the first intercalation substance 11 and the second intercalation substance 12. Specifically, the distance between the layered substance 2 in the conductive region B and the sealing member 3 on the conductive region B is smaller than the diameter of the first intercalation substance 11 and the second intercalation substance 12. The sealing member 3 and the layered substance 2 may be in contact with each other.

The sealing member 3 restricts an increase in the thickness of the layered substance 2. Neither the first intercalation substance 11 nor the second intercalation substance 12 can pass through the conductive region B due to the sealing member 3. The p-type region A, the conductive region B, and the n-type region C are not mixed but separated by the sealing member 3. The second intercalation substance 12 is easy to be leaked from an end of the layered substance 2 in the n-type region C, when this end is opened. Therefore, this end is preferably sealed by an unillustrated sealing member to prevent the leakage of the second intercalation substance 12. When the cover member 4 is not formed, the end of the layered substance 2 in the p-type region A is also preferably sealed in the same way. In order to restrict the thickness of the layered substance 2 to inhibit the first intercalation substance 11 and the second intercalation substance 12 from passing through the layered substance 2 by the sealing member 3, the distance between the layered substance 2 in the conductive region B and the sealing member 3 on the conductive region B is preferably smaller than the diameter of the substance having the smallest diameter, selected from the first intercalation substance 11 and the second intercalation substance 12. When a sealing member 3 made of a conductive material is formed on both ends of the layered substance 2, these sealing members 3 can function as an anode electrode or a cathode electrode of the semiconductor device 200 (diode).

The cover member 4 is a member formed for a reason relating to a manufacture. The cover member 4 has a function of preventing intercalation and desorption of the intercalation substance in the separated region. The cover member 4 may be made of a conductive material or an insulating material. The cover member 4 may be removed after a required process according to a design of the semiconductor device.

Subsequently, a manufacturing method of the semiconductor device 200 in FIG. 4 will be described with reference to process conceptual views in FIGS. 5, 6, and 7.

Figure 5:
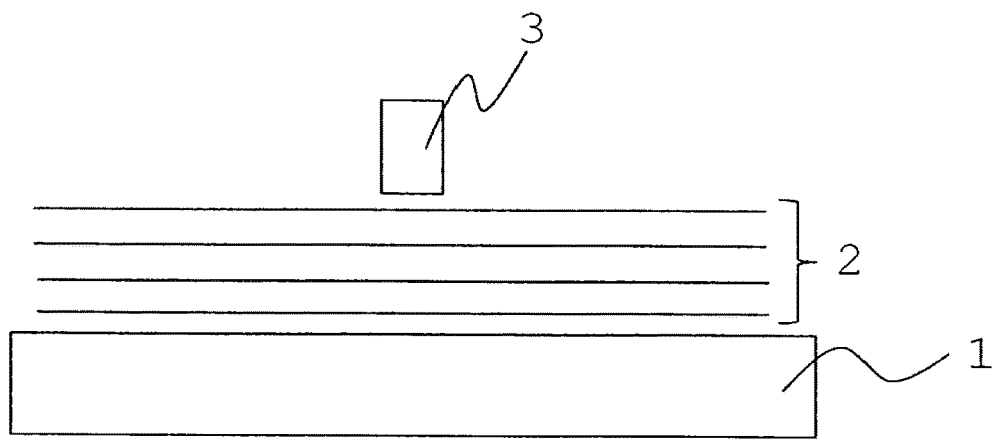
FIG. 5 is a process conceptual view illustrating a manufacturing process of the semiconductor device according to the embodiment.

In a member 201 illustrated in the process conceptual view in FIG. 5, the layered substance 2 is formed on the substrate 1, and further, the sealing member 3 is formed. The sealing member 3 is formed such that material of the sealing member 3 is deposited and processed with a mask to have a target shape. The sealing member 3 is fixed on an unillustrated portion of the substrate 1.

Figure 6:
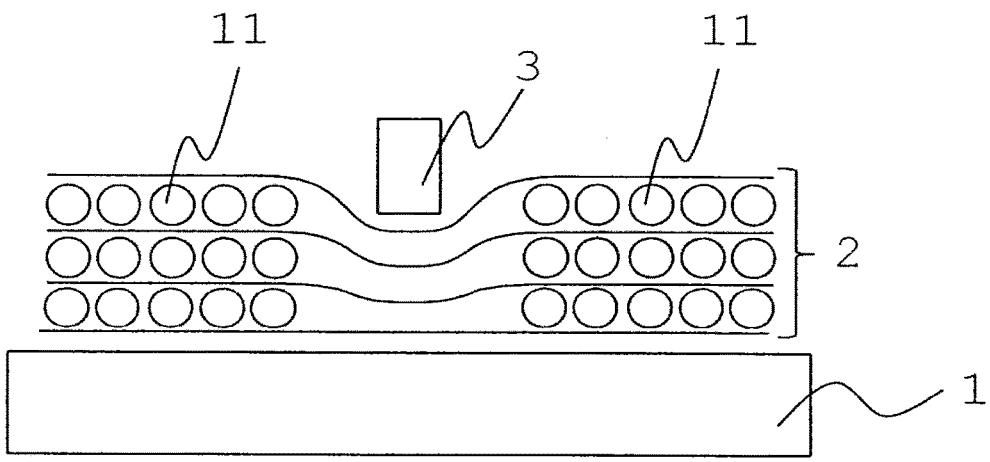
FIG. 6 is a process conceptual view illustrating a manufacturing process of the semiconductor device according to the embodiment.

In a member 202 illustrated in the process conceptual view in FIG. 6, the first intercalation substances 11 are intercalated in the member 201. The first intercalation substance 11 cannot be intercalated in the layered substance 2 below the vicinity of the sealing member 3 due to the sealing member 3. The first intercalation substances 11 are intercalated between layers of the layered substance 2 in the region where the first intercalation substances 11 can be intercalated.

Figure 7:
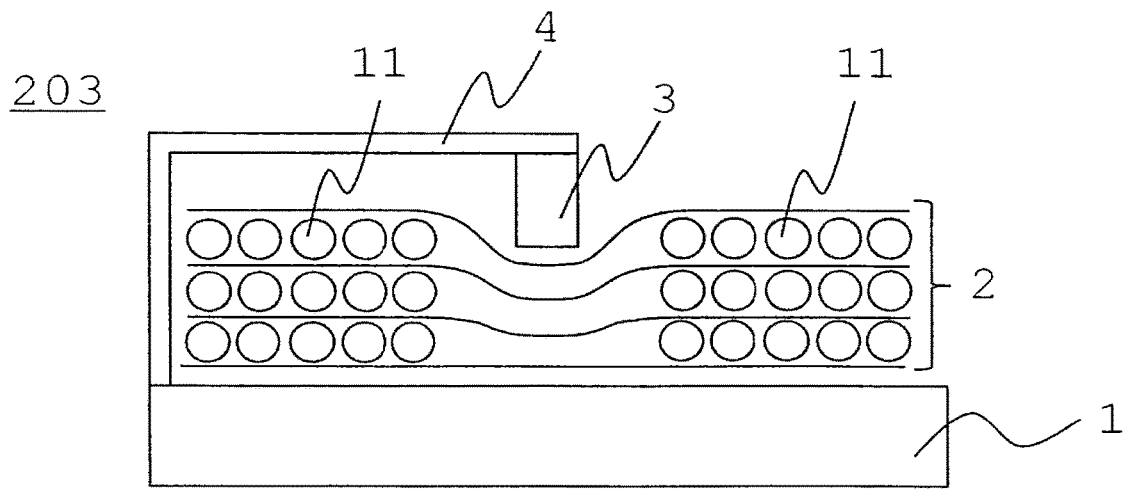
FIG. 7 is a process conceptual view illustrating a manufacturing process of the semiconductor device according to the embodiment.

The cover member 4 is formed on the member 202 in a member 203 illustrated in the process conceptual view in FIG. 7. The leakage of the first intercalation substance 11 from one end of the layered substance 2 is prevented by the cover member 4. The first intercalation substance 11 can be leaked and desorbed from the end of the layered substance 2 where the cover member 4 is not formed. The cover member 4 is formed in the same manner as the sealing member 3. Then, a heat treatment is performed to the member 203 to allow the first intercalation substance 11 to be desorbed from the end of the layered substance 2 at the side where the cover member 4 is not formed. The intercalation substance which presents in a region other than the region between the cover member and the sealing member is desorbed from between layers of the layered substance by the heat treatment. Next, the second intercalation substances 12 are intercalated between layers of the layered substance 2 from the end of the layered substance 2 on which the cover member 4 is not formed. The intercalation of the second intercalation substance 12 to the region separated by the sealing member 3 and the cover member 4 is inhibited by the sealing member 3. According to this process, the semiconductor device 200 having the type region A, the conductive region B, and the n-type region C in FIG. 4 can be obtained. The method of intercalating the second intercalation substances 12 between layers of the layered substance 2 is the same as the method of intercalating the first intercalation substances 11.

Third Embodiment

A semiconductor device according to the third embodiment includes: a layered substance formed by laminating two-dimensional substances in two or more layers, wherein the layered substance includes a p-type region having a first intercalation substance between layers of the layered substance, the layered substance includes a conductive region that is adjacent to the p-type region and that does not include the first intercalation substance, a sealing member is formed on the conductive region, and a distance between the layered substance in the conductive region and the sealing member on the conductive region is smaller than a diameter of a substance, having the smallest diameter, of the first intercalation substance. The sealing member has a shape along a shape of the region where the intercalation substances are intercalated. The n-type and p-type in the semiconductor device may be reversed.

Figure 8:
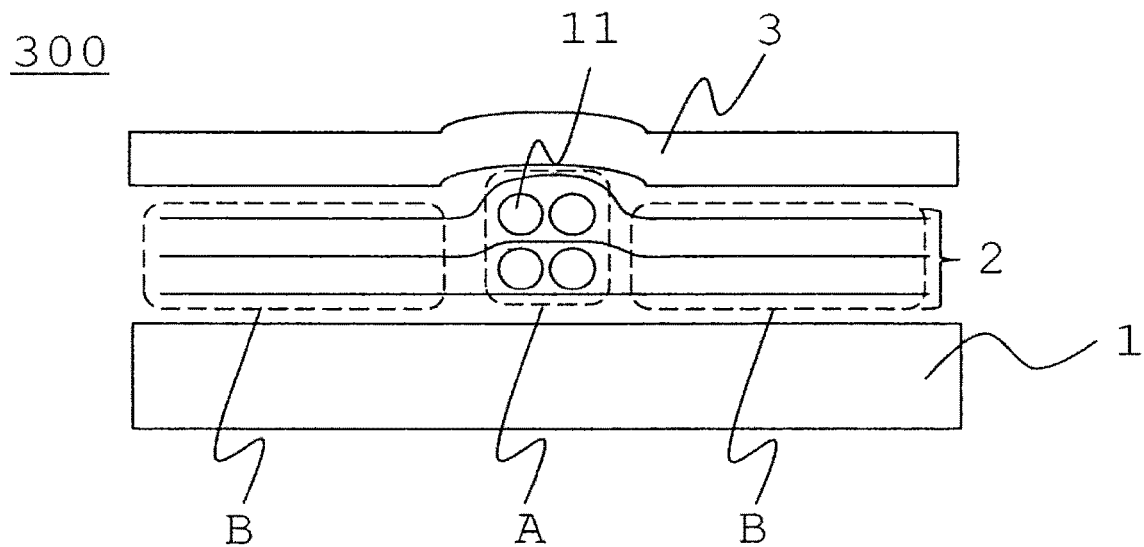
FIG. 8 is a conceptual view of a semiconductor device according to an embodiment.

FIG. 8 is a conceptual view of a semiconductor device 300 according to the third embodiment. The semiconductor device 300 in FIG. 8 includes a substrate 1, a layered substance 2, a sealing member 3, and first intercalation substances 11. A p-type region A is adjacent to conductive regions B, and present between the conductive regions B. The semiconductor device 300 according to the third embodiment is similar to the semiconductor device 100 according to the first embodiment and the semiconductor device 200 according to the second embodiment in many points. The description of the similar configuration and manufacturing method will partly be skipped.

The sealing member 3 has a shape along a shape of the region where the first intercalation substances 11 are intercalated. The sealing member 3 is preferably made of a plastic deformable material. Different from the semiconductor device according to the first embodiment, the sealing member is formed on the p-type region A and the conductive regions B. The sealing member 3 formed on the region where the first intercalation substances 11 are intercalated projects into a convex shape so as to correspond to a volume of the first intercalation substances 11. The distance between the sealing member 3 other than the projecting portion having the convex shape and the layered substance 2 is smaller than the smallest diameter of the first intercalation substance 11. In FIG. 8, the p-type region A and the conductive regions B on both sides of the p-type region A are formed. However, the p-type region A and the n-type region C may also be formed.

Subsequently, a manufacturing method of the semiconductor device 300 in FIG. 8 will be described with reference to process conceptual views in FIGS. 9 and 10.

Figure 9:
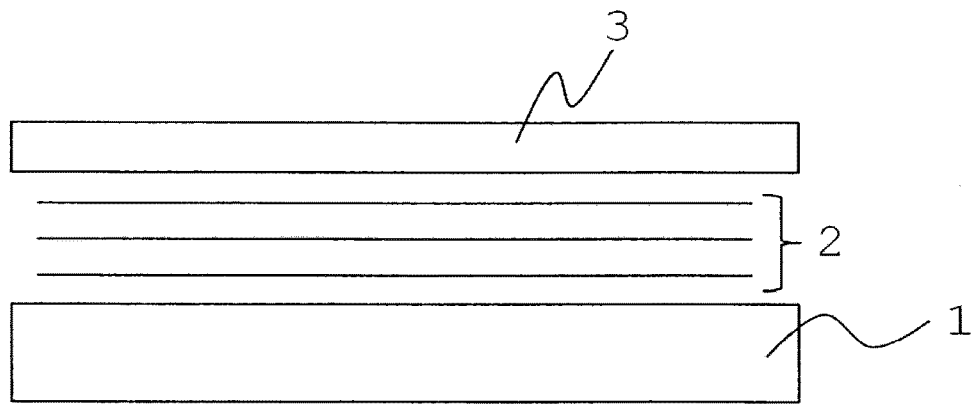
FIG. 9 is a process conceptual view illustrating a manufacturing process of the semiconductor device according to the embodiment.

In a member 301 illustrated in the process conceptual view in FIG. 9, the layered substance 2 is formed on the substrate 1, and further, the sealing member 3 is formed. The sealing member 3 is formed by depositing material of the sealing member 3. The sealing member 3 is fixed on an unillustrated portion of the substrate 1.

Figure 10:
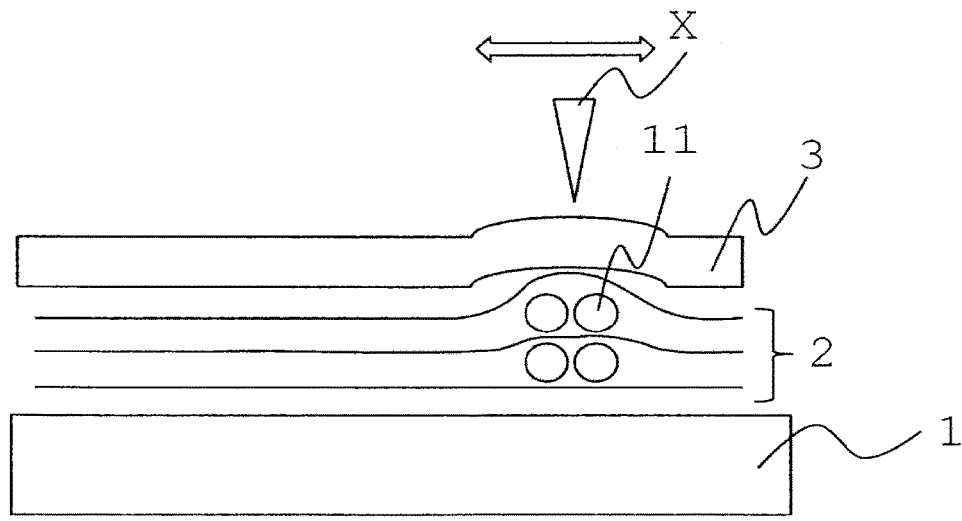
FIG. 10 is a process conceptual view illustrating a manufacturing process of the semiconductor device according to the embodiment.

In a member 303 illustrated in the process conceptual view in FIG. 10, a heat treatment X is performed to the member 302. The heat treatment X is performed under a presence of the first intercalation substances 11 (in a vapor phase or liquid phase). The heat treatment X is not performed to the entire sealing member 3, but locally performed only to the portion where the first intercalation substances 11 are intercalated. When the first intercalation substances 11 are intercalated between layers of the layered substance 2, the heat treatment X is preferably performed from the end of the layered substance 2. The sealing member 3 is deformed due to the heat treatment. X, whereby the region in which the first intercalation substances 11 can be intercalated between layers of the layered substance 2 is generated. The first intercalation substances are intercalated in this region. The p-type region A formed by the intercalation moves to the position illustrated in the conceptual view in FIG. 8 by moving the heat-treated region. Laser or electron beam that can be emitted to a very small area is preferably used for the heat treatment X.

Fourth Embodiment

A semiconductor device according to the fourth embodiment includes: a substrate, an electrode in the substrate, a layered substance formed on the substrate by laminating two-dimensional substances in two or more layers, and electrodes on both ends of the layered substance, wherein the layered substance includes a p-type region having a first intercalation substance between layers of the layered substance and two n-type regions each having a second intercalation substance between layers of the layered substance, each of the two n-type regions is present between the p-type regions, the layered substance includes a conductive region that is adjacent to the p-type region and the n-type region and that includes neither the first intercalation substance nor the second intercalation substance, a sealing member is formed on the conductive region, or on the conductive region and an end of the layered substance, and a distance between the layered substance in the conductive region and the sealing member on the conductive region is smaller than a diameter of a substance having the smallest diameter selected from the first intercalation substance and the second intercalation substance. The semiconductor device according to the fourth embodiment functions as a field effect transistor. The semiconductor device according to the embodiment can be applied to an n-type region and a p-type region of a transistor other than the field effect transistor. The n-type and p-type in the semiconductor device may be reversed.

Figure 11:
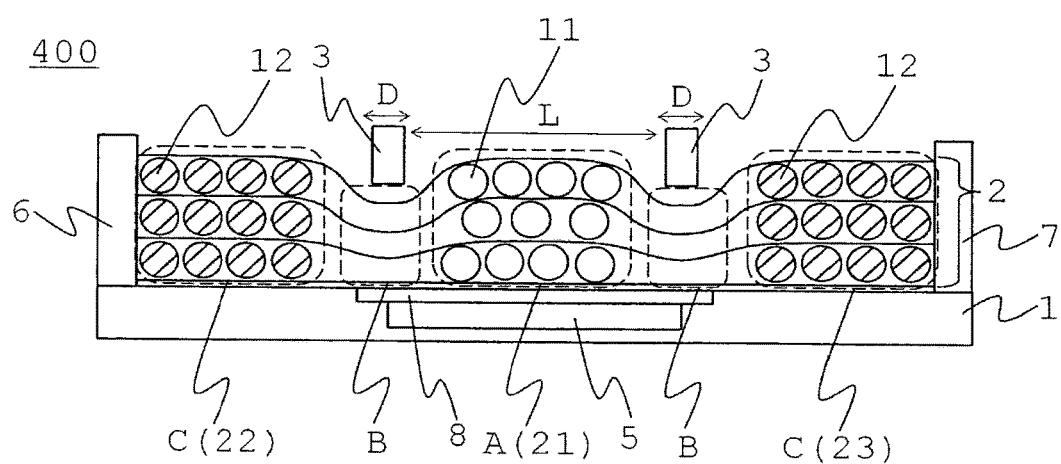
FIG. 11 is a conceptual view of a semiconductor device according to an embodiment.

FIG. 11 is a conceptual view of a semiconductor device 400 according to the fourth embodiment. The semiconductor device in FIG. 11 includes a substrate 1, a layered substance 2, a sealing member 3, a first electrode 5, a second electrode 6, a third electrode 7, an insulating film 8, first intercalation substances 11, and second intercalation substances 12. A conductive region B is present between a p-type region A and an n-type region C, and the p-type region A is present between two n-type regions C. The semiconductor device 400 according to the fourth embodiment is similar to the semiconductor device 100 according to the first embodiment, the semiconductor device 200 according to the second embodiment, and the semiconductor device 300 according to the third embodiment in many points. The description of the similar configuration will partly be skipped. The manufacturing technique described in the first to third embodiments can be applied to a manufacturing method of the semiconductor device 400 according to the fourth embodiment.

The first electrode 5 is buried in the substrate 1 as a gate electrode, and the insulating film 8 such as $SiO_2$ is formed on the first electrode 5 as a gate insulating film. The p-type region A becomes a channel portion 21 of the field effect transistor. One of the n-type regions A becomes a source portion 22 of the field effect transistor. One of the n-type regions A becomes a drain portion 23 of the field effect transistor. A length L of the channel region is typically 1 nm or more and 100 nm or less. A width D of the sealing member 3 is typically 1 nm or more and 10 nm or less. The n-type and p-type in the semiconductor device may be reversed.

The density of electrons or holes in the layered substance is low in the channel portion 21, and the density of electrons or holes can be changed by applying voltage to the gate electrode 5. The density of electrons or holes is high, and a resistance is low, in the source portion 22 and the drain portion 23, whereby they can be used as a source electrode and a drain electrode respectively. The semiconductor device described above functions as a field effect transistor. The second electrode 6 and the third electrode 7 function as the source electrode and the drain electrode respectively, but they may be eliminated.

Fifth Embodiment

A superconducting device according to the fifth embodiment includes: a layered substance formed by laminating two-dimensional substances in two or more layers, wherein the layered substance includes a superconducting region having a third intercalation substance between layers of the layered substance, the layered substance includes a conductive region that is adjacent to the superconducting region and that does not include the third intercalation substance, a sealing member is formed on the conductive region, and a distance between the layered substance in the conductive region and the sealing member on the conductive region is smaller than a diameter of a substance, having the smallest diameter, of the third intercalation substance. The manufacturing technique described in the first to third embodiments can be applied to a manufacturing method of the superconducting device according to the fifth embodiment.

Figure 12:
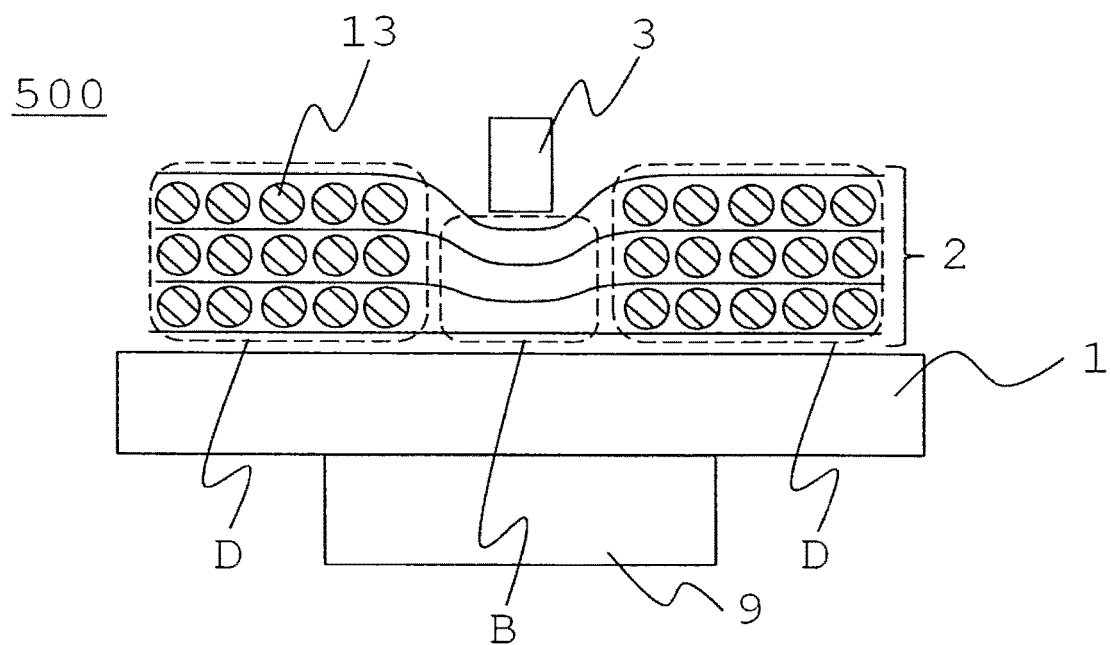
FIG. 12 is a conceptual view of a superconducting device according to an embodiment.

FIG. 12 is a conceptual view illustrating a superconducting device 500 according to the fifth embodiment. The superconducting device 500 in FIG. 12 includes a substrate 1, a layered substance 2, a sealing member 3, third intercalation substances 13, and a refrigerator 9. The superconducting device 500 is preferably cooled under vacuum insulation by using a vacuum insulation container and a pressure reducing device, which are not illustrated. The refrigerator 9 is used to bring a superconducting region D into a superconducting state. The cooling process may satisfy a required condition for bringing the superconducting region D into a superconducting state. The superconducting device 500 includes superconducting regions D in which the layered substance 2 is made into a superconducting material by the third intercalation substance 13, and a conductive region B sandwiched between the superconducting regions D and having general conductivity.

The layered substance 2 is a laminate containing one or more types selected from graphite, multi-layer graphene, FeAs, TiNCl, and $Bi_2Se_3$, for example.

One or more elements selected from Li, Na, K, Rb, Cs, Be, Mg, Ca, Sr, Y, Sc, Ba, Eu, Sm, Yb, and Cu can be used for the third intercalation substance 13. An alkali metal element, alkaline earth metal element or a rare-earth element such as Li, Na, K, Ca, or Yb can be used for the third intercalation substance 13.

When the superconducting region D is in the superconducting state, the device according to the embodiment has a Josephson junction of superconductor-normal conductor-superconductor junction type.

In the specification, some elements are represented by an element symbol.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising: a layered substance formed by laminating two-dimensional substances in two or more layers,
   wherein the layered substance includes at least either one of a p-type region having a first intercalation substance between layers of the layered substance and an n-type region having a second intercalation substance between layers of the layered substance,
   the layered substance includes a conductive region that is adjacent to at least either one of the p-type region and the n-type region and that includes neither the first intercalation substance nor the second intercalation substance,
   a sealing member is formed on the conductive region, or on the conductive region and an end of the layered substance, and a distance between the layered substance in the conductive region and the sealing member on the conductive region is smaller than a diameter of a substance having the smallest diameter selected from the first intercalation substance and the second intercalation substance.

2. The semiconductor device according to claim 1, wherein the layered substance includes the p-type region and the n-type region, the conductive region is formed between the p-type region and the n-type region, and the p-type region and the n-type region form a pn junction or pin junction.

3. The semiconductor device according to claim 1, wherein the first intercalation substance is a molecule or compound containing one or more elements selected from F, Cl, Br, I, O, S, N, and P, and the second intercalation substance includes one or more elements selected from Li, Na, K, Rb, Cs, Be, Mg, Ca, Sr, Y, Sc, Ba, Eu, Sm, Yb, Hg, and Tl.

4. The semiconductor device according to claim 1, wherein the layered substance is a laminate of one or more types selected from graphite, multi-layer graphene, and h-BN.

5. The semiconductor device according to claim 1, wherein the layered substance is a laminate of a compound containing any of elements selected from Ti, Zr, Hf, V, Nb, Ta, Mo, W, Ga, In, Ge, Sn, Pb, and Bi, and any of elements selected from S, Se, Te, and O.

6. The semiconductor device according to claim 1, wherein the sealing member on the end of the layered substance has conductivity, and the sealing member is an electrode of the semiconductor device according to claim 1.

7. A superconducting device comprising: a layered substance formed by laminating two-dimensional substances in two or more layers, wherein the layered substance includes a superconducting region having a third intercalation substance between layers of the layered substance, the layered substance includes a conductive region that is adjacent to the superconducting region and that does not include the third intercalation substance, a sealing member is formed on the conductive region, and a distance between the layered substance in the conductive region and the sealing member on the conductive region is smaller than a diameter of a substance, having the smallest diameter, of the third intercalation substance.

8. The superconducting device according to claim 7, wherein the third intercalation substance is one or more elements selected from Li, Na, K, Rb, Cs, Be, Mg, Ca, Sr, Y, Sc, Ba, Eu, Sm, Yb, and Cu.

9. The superconducting device according to claim 7, wherein the layered substance is a laminate of one or more types selected from graphite, multi-layer graphene, FeAs, TiNCl, and $Bi_2Se_3$.

* * * * *